United States Patent
Fulford, Jr. et al.

[19]

[11] Patent Number: 6,118,137
[45] Date of Patent: Sep. 12, 2000

[54] TEST STRUCTURE RESPONSIVE TO ELECTRICAL SIGNALS FOR DETERMINING LITHOGRAPHIC MISALIGNMENT OF CONDUCTORS RELATIVE TO VIAS

[75] Inventors: H. Jim Fulford, Jr.; Mark I. Gardner; Fred N. Hause, all of Austin, Tex.

[73] Assignee: Advanced Micro Devices, Inc., Sunnyvale, Calif.

[21] Appl. No.: 08/925,383

[22] Filed: Sep. 8, 1997

[51] Int. Cl.$^7$ ....................................................... H01L 23/58
[52] U.S. Cl. ............................................................. 257/48
[58] Field of Search ................................. 257/48; 438/11, 438/18; 324/754

[56] References Cited

U.S. PATENT DOCUMENTS

| | | |
|---|---|---|
| 3,751,647 | 8/1973 | Maeder et al. . |
| 3,842,491 | 10/1974 | Depuy et al. . |
| 4,103,228 | 7/1978 | Ham ........................................ 324/537 |
| 5,357,403 | 10/1994 | Haller et al. ............................. 361/794 |
| 5,506,450 | 4/1996 | Lee et al. ................................. 257/767 |
| 5,553,274 | 9/1996 | Liebmann . |
| 5,699,282 | 12/1997 | Allen et al. ................................ 702/85 |
| 5,705,301 | 1/1998 | Garza et al. . |
| 5,707,765 | 1/1998 | Chen . |
| 5,723,233 | 3/1998 | Garza et al. . |
| 5,773,315 | 6/1998 | Jarvis . |

*Primary Examiner*—Brian Dutton
*Attorney, Agent, or Firm*—Kevin L. Daffer; Conley, Rose & Tayon

[57] ABSTRACT

The present invention advantageously provides a method for determining lithographic misalignment of a conductive element relative to a via. An electrically measured test structure is provided which is designed to have targeted via areas shifted from midlines of corresponding targeted conductor areas. Further, the test structure is designed to have a test pad that electrically communicates with the targeted via areas. Design specifications of the test structure require the midlines of the conductor areas to be offset from the via areas by varying distances. The above-mentioned method involves processing the designed test structure. An electrical signal may then be applied to each of the conductors while it is also being applied to the test pad. The resulting electrical response should be proportional to the distance that a conductor is misaligned from its desired location. Using the electrical responses for all the conductors, it is possible to determine the direction and amount of misalignment.

17 Claims, 6 Drawing Sheets

TEST STRUCTURE RESPONSIVE TO ELECTRICAL SIGNALS FOR DETERMINING LITHOGRAPHIC MISALIGNMENT OF CONDUCTORS RELATIVE TO VIAS

BACKGROUND OF THE INVENTION

1. Field of the Invention

This invention relates to integrated circuit fabrication and, more particularly, to an electrically measurable test structure that may be used to determine lithographic misalignment of conductive elements relative to vias employed by the integrated circuit.

2. Description of the Related Art

Modern integrated circuits contain numerous structures or features, typically the size of a few micrometers. The features are placed in localized areas, and are either conductive, non-conductive or semi-conductive (i.e., rendered conductive in defined areas with dopants). A technique known as photolithography or "lithography" is used to place such features. Lithography entails radiation used to pattern a photosensitive film. An optical image is transferred to the film from a patterned mask placed in proximity to the film. The photosensitive film, i.e., "photoresist" has two main properties. First, solubility of the resist changes in response to it being exposed to appropriate radiation. Second, a hardened resist is resistant to attack by an etchant capable of removing selectively exposed conductive and/or insulative material.

According to a sequence of lithographic steps, the resist is first applied to a semiconductor topography. Next, a partially transparent mask is placed in proximity to the topography. Patterns upon the mask are projected upon the topography using various forms of radiation. Ultraviolet light is the primary form of radiation that is used, but x-rays and a beam of electrons are growing in popularity. The radiation is transmitted through only the transparent portions of the mask plate to the photoresist film. The resist solubility of regions that are exposed to radiation is altered by a photochemical reaction. The selectively exposed resist is then washed with a solvent that preferentially removes the resist areas of higher solubility. Subsequently, the now patterned resist is exposed to an etchant that removes those portions of the topography unprotected (i.e., not covered) by the resist. Finally, the photoresist film is removed, leaving a duplicate of the mask plate pattern etched into the substrate film.

During photolithography, it is necessary that the mask plate pattern be properly aligned relative to previously formed patterns upon the topography prior to being exposed to radiation. Typically, alignment is performed using a structure known as an "alignment mark". The alignment mark includes an alignment target that is formed in a layer of the topography (henceforth referred to as "substrate"). An alignment guide formed within the mask plate can then be visually or optically aligned with the alignment mark. Alignment is achieved by moving the mask plate until the alignment guide and the alignment target are correctly positioned with respect to each other. Perfect alignment of the patterned substrate to the desired image to be printed is rarely achieved.

Several factors limit alignment accuracy. For example, the step-and-repeat method used to pattern the mask plate (i.e., form the pattern upon the mask plate) by its nature leads to alignment errors across the mask. This method involves repeatedly imaging a master device pattern, i.e., reticle, on the mask plate to build a rectangular array. Proper alignment of two layers requires that the corresponding mask plates of the two layers have identical arrays, which is difficult to achieve. Further, the imaged size of the mask pattern may be slightly expanded or contracted in a linear manner relative to the substrate pattern. Expansion of the image can result during the step-and-repeat method or during photolithography. Contraction of the image may be a result of thermal expansion of the substrate or the mask plate. Even if the mask and substrate dimensions are correct, the equipment used for alignment of the mask plate to the wafer topography often makes errors.

In whatever form, proper alignment is necessary to avoid failure of devices employed across an integrated circuit. For instance, if interconnects (i.e., metal or polysilicon) structures are not properly positioned over vias (i.e., conductive plugs or openings placed through interlevel dielectrics), devices that should electrically communicate with each other may, in the extreme, actually be electrically isolated from each other. Even if the extreme scenario does not occur, slight misalignment of the via to the interconnect may cause devices to receive voltages or current less than the designed (or targeted) amount.

Optimum alignment of each layer to previously patterned layers is particularly necessary as the number of layers within an integrated circuit increases. To ensure that a lithographic system is performing accurate alignment during fabrication, a test structure is often formed directly upon the wafer itself. The test structure contains features, such as contacts and interconnects. Distance measurements are then made to determine how far features of the test circuit are shifted from their desired or targeted locations. Such measurements are often performed using an optical measurement system such as a scanning electron microscope ("SEM"). Unfortunately, these type of measurements are often time consuming. Further, accuracy of measurements made using an optical system may be limited by the resolution of the system or ability of the system to distinguish closely spaced objects.

It is therefore desirable to develop a test structure and method which can more rapidly determine misalignment than optical techniques. Such a method would prove beneficial in possibly locating the source of misalignment, and therefore allow for corrective measures to be taken to prevent future misalignment problems. To be a viable test structure, it is desired that it not only discern misalignment, but also to quantify misalignment and the direction of misalignment. Quantifying the amount and direction of misalignment provides indicia to an operator necessary for him or her to adjust for the misalignment on future wafer runs. The improved test structure might beneficially be employed prior to a wafer run, or between wafers runs to allow adjustment for subsequent lithographic alignments.

SUMMARY OF THE INVENTION

The problems outlined above are in large part solved by the alignment test structure hereof, and a method for determining lithographic misalignment using such a test structure. That is, a test structure is provided which is designed to have targeted via areas shifted from midlines of corresponding targeted conductor areas. As used hereinbelow, "targeted" areas are those areas designed to receive a feature, such as a via or conductor. In most instances, the layout dictates where the targeted areas are located. It is desired that the targeted areas correspond to the actual fabricated areas upon the mask and semiconductor topography. However, this is not usually the case. During mask production or during lithography upon the topography, the via or conductor ends up being at locations shifted from the targeted area. This is known as misalignment.

The present test structure is designed to have a test pad that electrically communicates with the targeted via areas. Design specifications of the test structure require the midlines of the conductor areas to be offset from the via areas by varying distances. As defined herein, midlines are the central axis along which the conductor extends. The lateral edges of each conductor extend equal distances from the corresponding midline. The locations of some of the targeted conductor areas are chosen so that the conductor areas are removed completely from their corresponding vias. The locations of other targeted conductor areas are selected so that the conductor areas partially overlap vias.

It is recognized that the test structure contains target feature areas, i.e., targeted via and conductor areas. Thus, the test structure is purposefully drawn or "laid out" such that the targeted via and conductor areas are shifted with respect to each other. Where the actual features will reside depends upon the direction and magnitude of lithographic misalignment. Misalignment during production of vias and conductors upon the topography may add to the shift or subtract from the shift. The present test structure is designed to quantify misalignment and the direction of misalignment given the amount of pre-existing, targeted shift.

In an embodiment, the above-described test structure is fabricated by first forming an interlevel dielectric across a source/drain region (or active region) of a silicon-based substrate. Openings are etched vertically through the interlevel dielectric to the source/drain region. The openings may then filled with a conductive material or form plugs. Alternatively, the openings can be left open. A conductive layer is deposited to a varying degree across the plugs or openings. If the openings were not previously filled with a plug material, they are filled with the conductive layer provided alignment is present. Select portions of the conductive layer are then removed using optical lithography and an etch step to form conductors proximate each of the plugs or openings. The patterned conductive layer extends from an area proximate to the plugs or openings. A single test pad is coupled to the source/drain region to which each plug or conductor-filled opening is coupled. An electrical signal is applied sequentially to each of the conductors at the same time that it is applied to the test pad. The test pad and conductor extending therefrom is quite wide and is designed such that even a relatively large misalignment of the test pad conductor will nonetheless couple to each plug or conductor-filled opening. The plug or conductor-filled opening is henceforth generically referred to as a via. Electrical stimuli is applied, for example, to the test pad, and electrical response is read from a conductor. The response is deemed proportional to the distance by which each conductor is offset from its corresponding via.

Some of the electrical responses may be larger than their desired values while others may be smaller. For example, a first conductor that is targeted to completely overlap a via may, after lithographic placement, actually exhibit a larger resistance than expected while a second conductor that is targeted to partially overlap a via exhibits a lower actual resistance than expected. The observation of such a phenomena indicates that the first conductor is misaligned in a direction away from its corresponding via and the second conductor is misaligned in a direction toward its corresponding via. Further, the distances of misalignment can be determined by analyzing the variations of the electrical responses of the conductors from their predicted electrical responses. If the resistance measured between a conductor and the test pad is almost negligible, it can be inferred that the conductor overlaps much of the via. Therefore, the distance of misalignment is the distance between the actual via and actual conductor locations.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
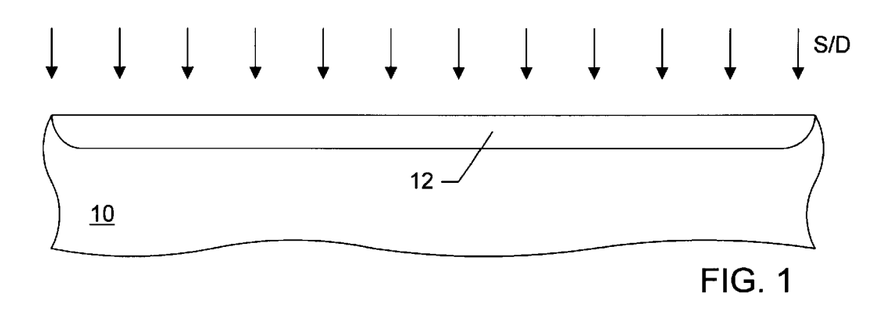
FIG. 1 depicts a cross-sectional view of a semiconductor topography in which dopants are forwarded into an upper portion of a silicon-based substrate to form a source/drain region therein.
Figure 2:
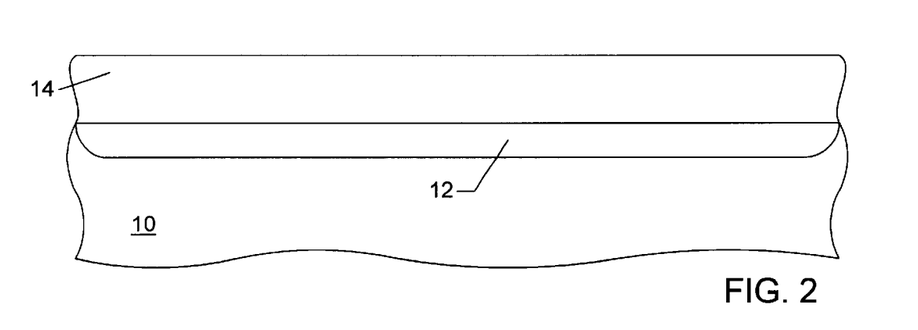
FIG. 2 depicts a cross-sectional view of the semiconductor topography, wherein an interlevel dielectric is formed across the silicon-based substrate.

Turning to FIG. 1, the first step in the fabrication of the alignment test structure of the present invention is shown according to one embodiment. A single crystalline silicon substrate 10 is provided. A source/drain ("S/D") implant is forwarded into an upper portion of substrate 10 to form a S/D (or active) region 12 therein. Alternately, region 12 may be a conductive layer and region 10 may be an interlevel dielectric arranged above another conductive layer or a gate conductor. However, the alternate configuration is less preferred since simplicity of the test structure is desired. FIG. 2 depicts the formation of an interlevel dielectric 14 across substrate 10. Interlevel dielectric 14 may be formed by the deposition of an oxide- or glass-based material.

Figure 3:
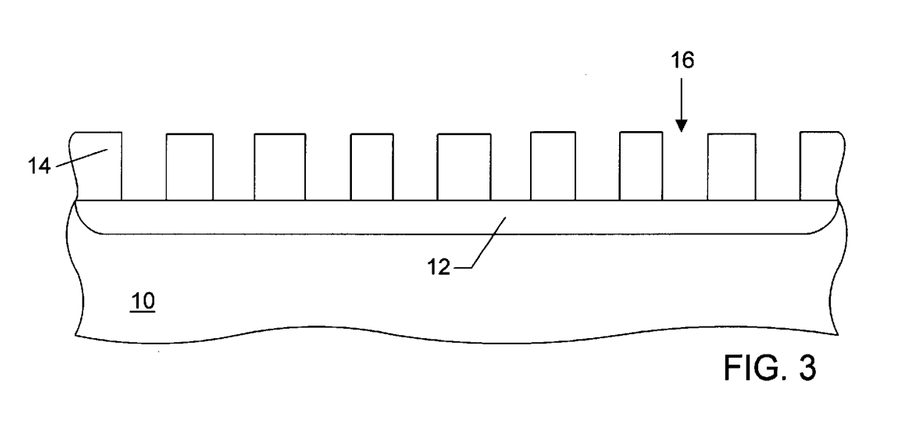
FIG. 3 depicts a cross-sectional view of the semiconductor topography, wherein openings are formed vertically through the interlevel dielectric down to the source/drain region.
Figure 4:
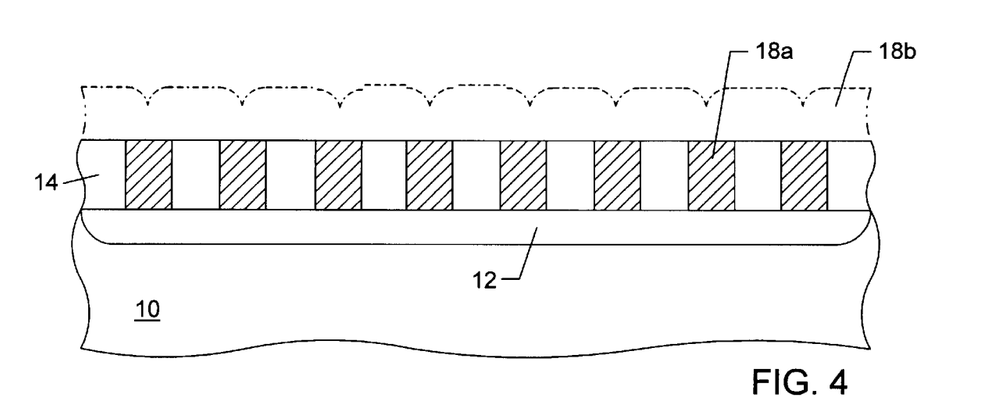
FIG. 4 depicts a cross-sectional view of the semiconductor topography, wherein the openings may be filled with a plug material according to one exemplary embodiment.
Figure 5:
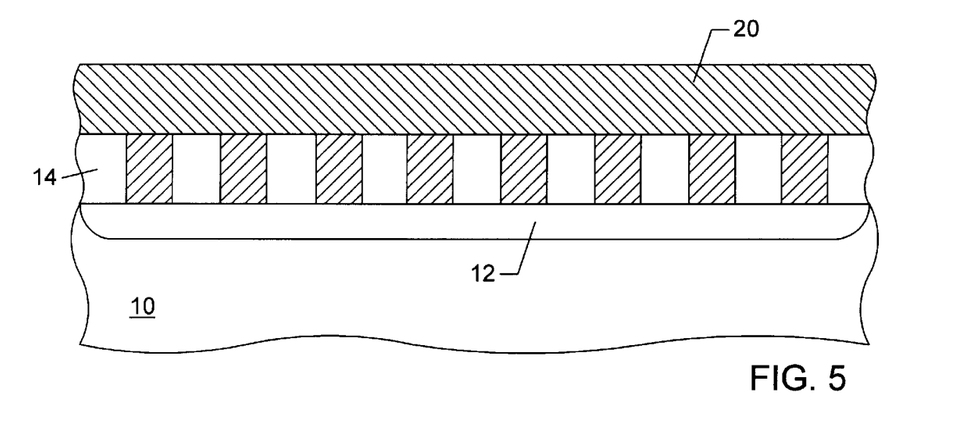
FIG. 5 depicts a cross-sectional view of the semiconductor topography, wherein a conductive layer is formed across the interlevel dielectric and vias.

As illustrated in FIG. 3, openings 16 may be formed vertically through interlevel dielectric 14 to the underlying S/D region 12. Openings 16 are formed by first patterning a photoresist masking layer (not shown) above interlevel dielectric 14 using photolithography. Portions of interlevel dielectric 14 that are not covered by the patterned photoresist layer may be removed using a plasma etch step. Etch duration is selected to last until regions of the surface of the underlying S/D region 12 are exposed by the removal of the overlying dielectric material. Turning to FIG. 4, a conductive material 18a, such as tungsten may be deposited into openings 16 and across interlevel dielectric 14. A portion 18b of the deposited material 18a may then be removed using, e.g., chemical mechanical polishing ("CMP") or sacrificial etchback. CMP results in the upper surface of the material arranged within openings 16 being level with the upper surface of interlevel dielectric 14. Portion 18b is typically known as a plug. Alternatively, openings 16 may be left open in readiness for a conductive material such as conductive layer 20 shown in FIG. 5 placed therein. FIG. 5 therefore indicates a conductive layer 20 placed into and across openings 16, or across plugs 18b. Conductive layer 20 is blanket deposited across the resulting semiconductor topography. Conductive layer 20 may be composed of a metal, such as aluminum commonly used for forming interconnects.

Figure 6:
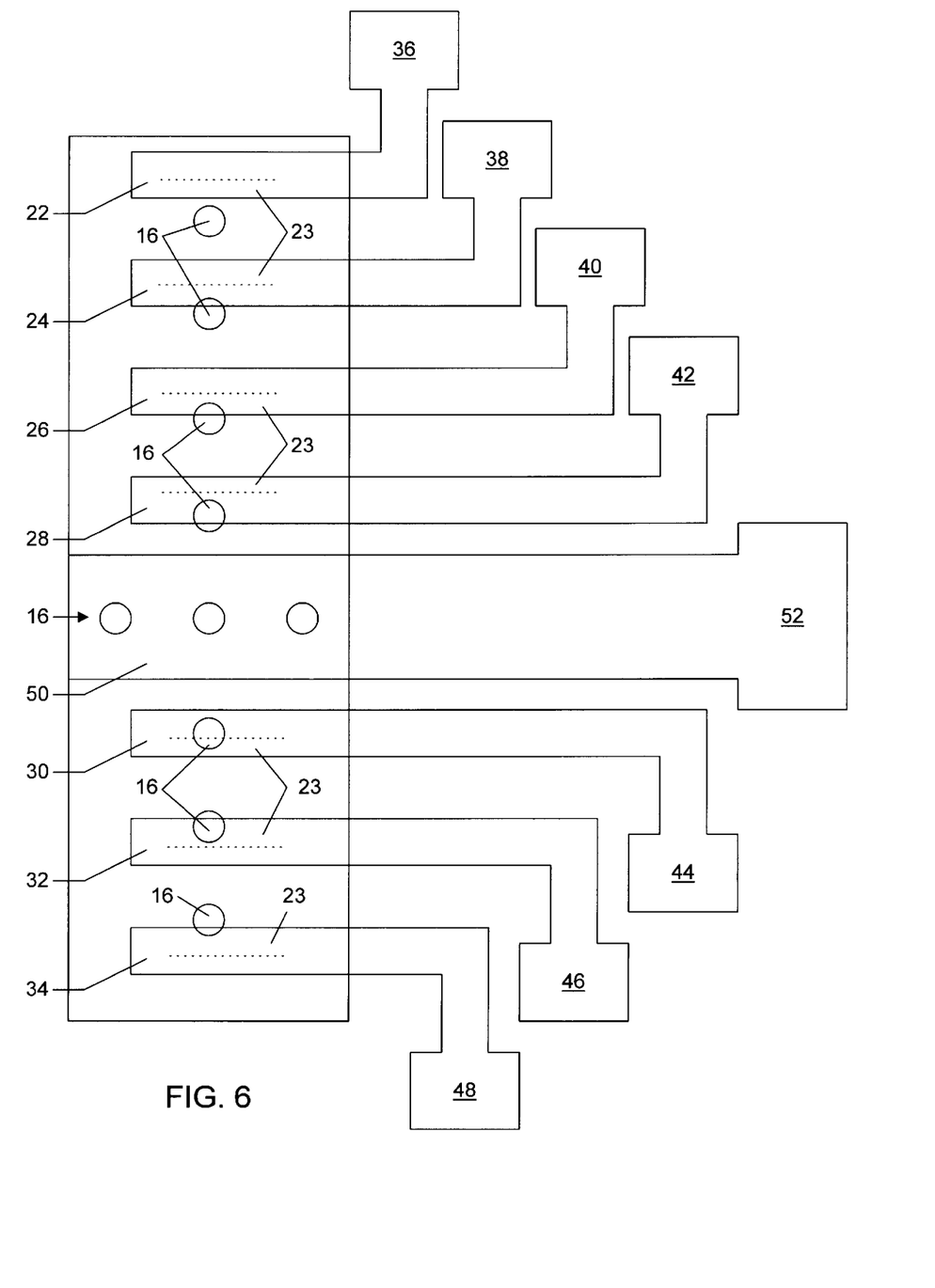
FIG. 6 depicts a top plan view of one embodiment of the targeted test structure according to a design layout in which midline targeted conductor areas are positioned at varying distances from corresponding targeted via areas to detect lithographic misalignment.

FIG. 6 depicts a top plan view of one embodiment of the desired configuration for the alignment test structure. The targeted conductor areas 22, 24, 26, 28, 30, 32, and 34 are shown lying parallel to each other in approximately the same horizontal plane. Each midline 23 of the targeted conductor areas is spaced from the center of a corresponding targeted via area 16. The distance between the midline of a conductor area and the corresponding via area varies for different targeted conductor areas. This distance may range between, for example, 0 to 90 nm which is chosen because typical misalignment distances that occur during processing are in this range. Further, the distance may increase by an incremental amount from one targeted conductor area to another. For instance, it may increase by increments of 10 nm or 20 nm. The test structure may have more targeted via areas and conductor areas than shown.

In the embodiment shown in FIG. 6, targeted conductor area 22 is shifted slightly above its corresponding via 16 so that it does not contact the via. Conductor areas 24, 26, 28, and 30 are each shifted slightly closer to their corresponding via 16 than the previous conductor area. Conductor area 30 is positioned such that it completely covers its corresponding via area 16 (i.e., midline 23 of conductor 30 is drawn to be directly over the center of the targeted via area 16). Conductor areas 32 and 34 are shifted away from their corresponding vias 16 in a direction opposite that of shifted conductor areas 22, 24, 26, and 28. Thus, the conductor areas are positioned so that some of them overlap vias 16 by different amounts. Further, some conductor areas are shifted directly above (in the drawing) their corresponding vias areas 16 while others are shifted directly below (in the drawing) their corresponding vias areas 16. Each of the targeted conductor areas includes a probe pad (probe pads 36, 38, 40, 42, 44, 46, and 48).

The test structure also includes a conductive element 50 that is designed to contact possibly three horizontally adjacent targeted via areas 16. Conductive element 50 is electrically linked to a test pad 52. Conductive element 50 may be wider than the targeted conductor areas. Thus, the test structure design ensures that conductive element 50 will be electrically coupled to at least one via even if misalignment occurs during processing of the conductive element. The test structure is designed such that an electrical signal may be applied to each of the probe pads sequentially while the signal is being applied to test pad 52. When such an electrical signal is applied to the probe pad of a conductor area and to test pad 52, the probe pad may be electrically linked to the test pad. Preferably, the electrical signal is in the form of a current applied at a pico- or micro-ampere range. An electrical response, e.g., voltage extracted to resistance may be read each time the electrical signal is applied. The electrical response is proportional to the distance a conductor area is offset from a corresponding via area 16. The use of such a small current helps promote a larger change in electrical response given small differences in lithographic misalignment. If currents are too large, variation in electrical response might be too small to detect, especially since a low resistivity material (i.e., plug) may fill targeted via areas 16. According to the design specifications of the test structure in FIG. 6, conductor area 30 should exhibit the largest voltage output while conductor area 22 should exhibit the least—given little if any misalignment. Conductor areas that overlap their corresponding vias more than other conductor areas should exhibit the largest voltage output if the same current stimuli is applied between the test pad and all conductors.

Figure 7:
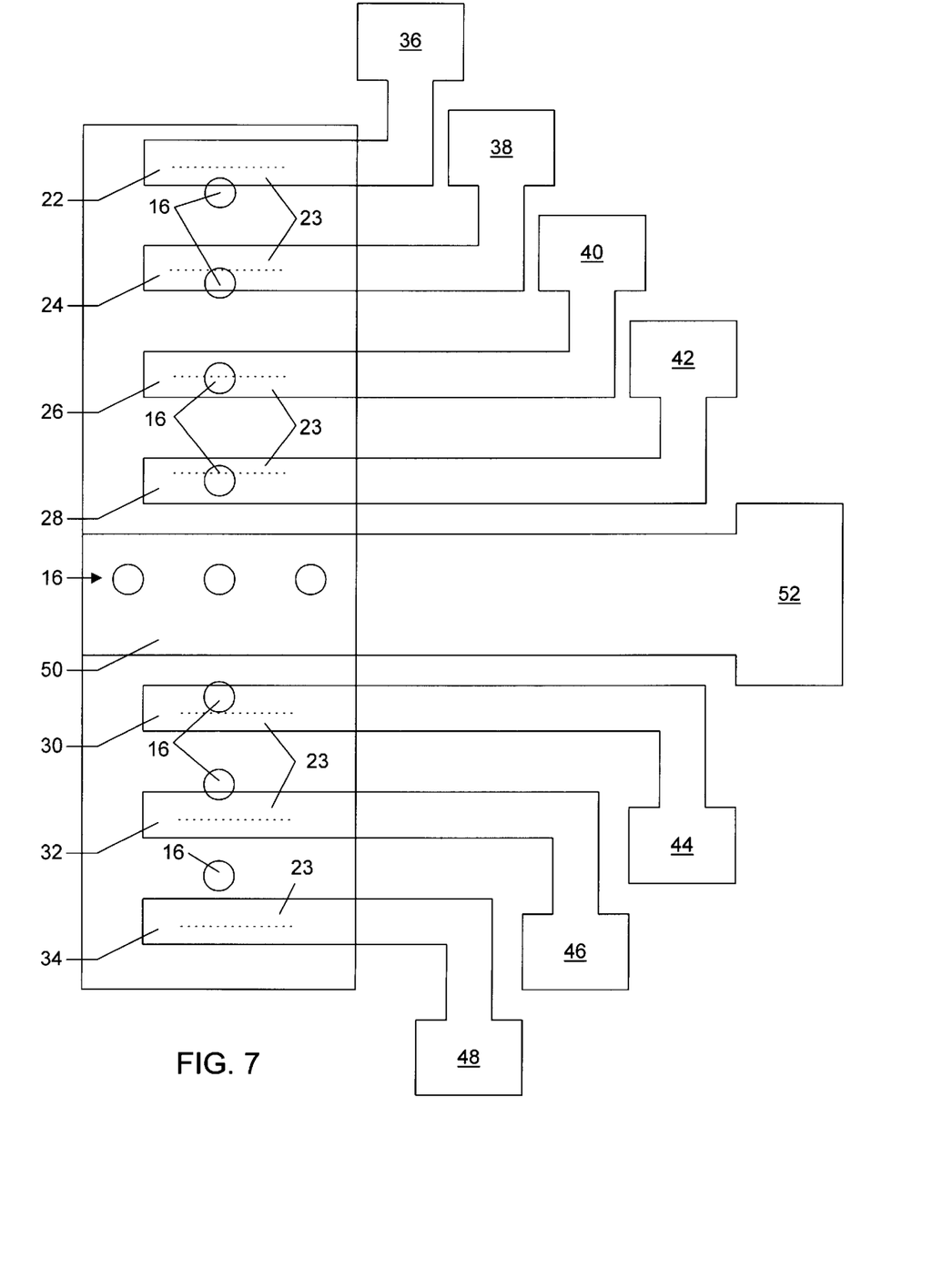
FIG. 7 depicts a top plan view of the processed test structure, wherein portions of the conductive layer are removed to form conductors at misaligned distances from corresponding vias.

FIG. 7 shows one possible embodiment of the test structure, and the relationship of various features of that test structure, after fabrication upon a semiconductor topography. Conductors 22, 24, 26, 28, 30, 32, and 34 of the processed test structure may be formed by removing regions of conductive layer 20 (shown in FIG. 5). The removal of those regions may be performed by using lithography followed by a plasma etch. Misalignment of the conductors may occur as shown. The midlines 23 of the conductors are shifted downward (in FIG. 7) from their desired locations (see targeted conductor areas in FIG. 6). Fortunately, the direction of this shift and the misalignment distance may be determined. An electrical signal may be applied to each of the conductor probes pads sequentially and to test pad 52. The electrical response reading of resistance or voltage may be compared to the predicted resistance or voltage, respectively. In the present example, the processed conductors 22, 24, 26, and 28 exhibit a higher voltage output than expected. Further, conductors 30, 32, and 34 exhibit a lower voltage output than expected. Thus, it may be inferred that the conductors are shifted downward from their desired locations. Also, the conductor that exhibits highest voltage output is conductor 28 instead of conductor 30. Thus, it may be concluded that the conductors are misaligned from their desired locations by a distance that is about the same as the "designed" (and therefore known and predefined) distance between the midline 23 of the targeted conductor area 28 and the corresponding targeted via area 16 (see FIG. 6).

Figure 8:
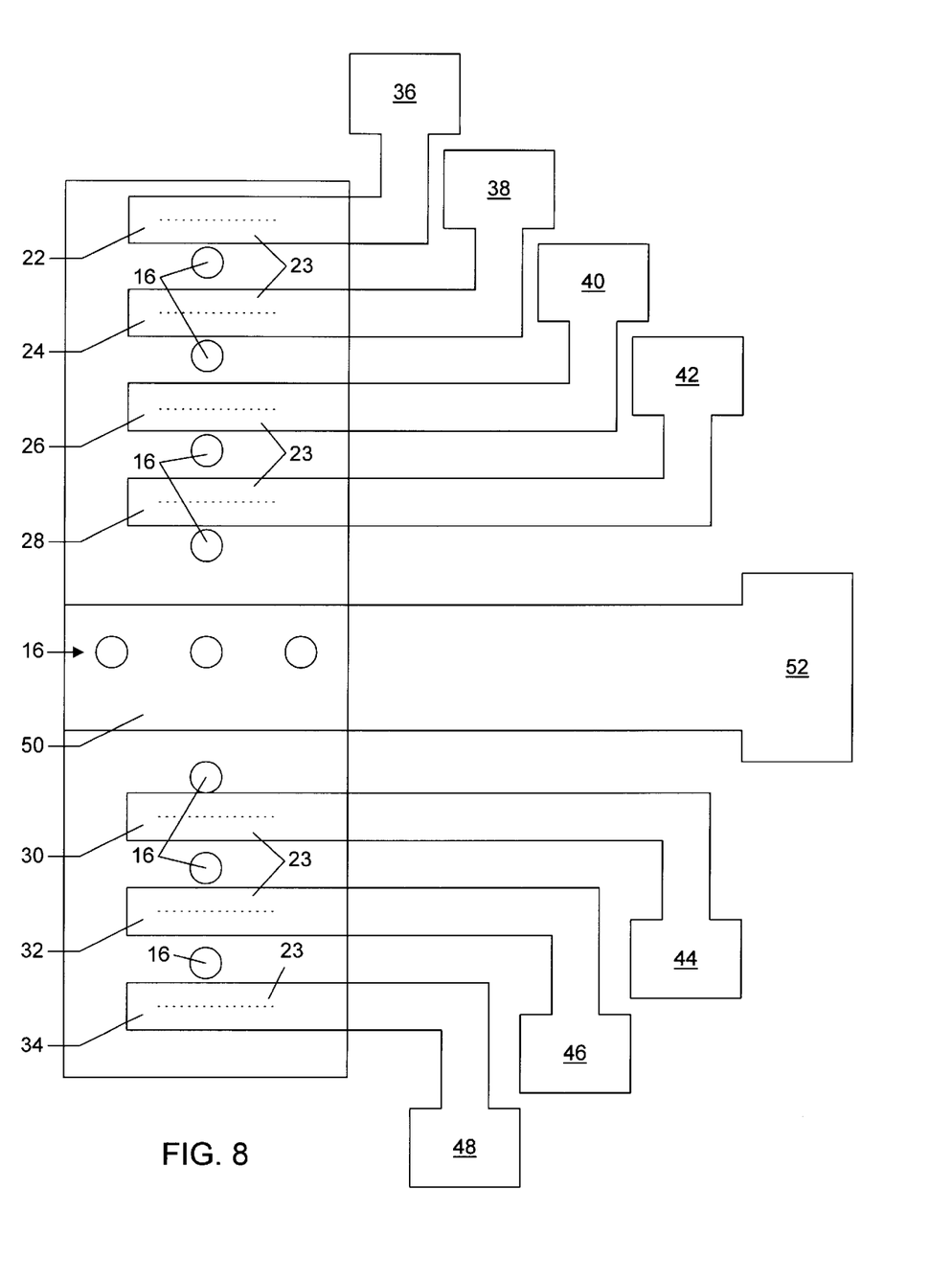
FIG. 8 depicts a top plan view of another embodiment of the targeted test structure according to a design layout in which the entire targeted conductor areas are positioned at alternate varying distances from corresponding targeted via areas to detect vertical misalignments.
Figure 9:
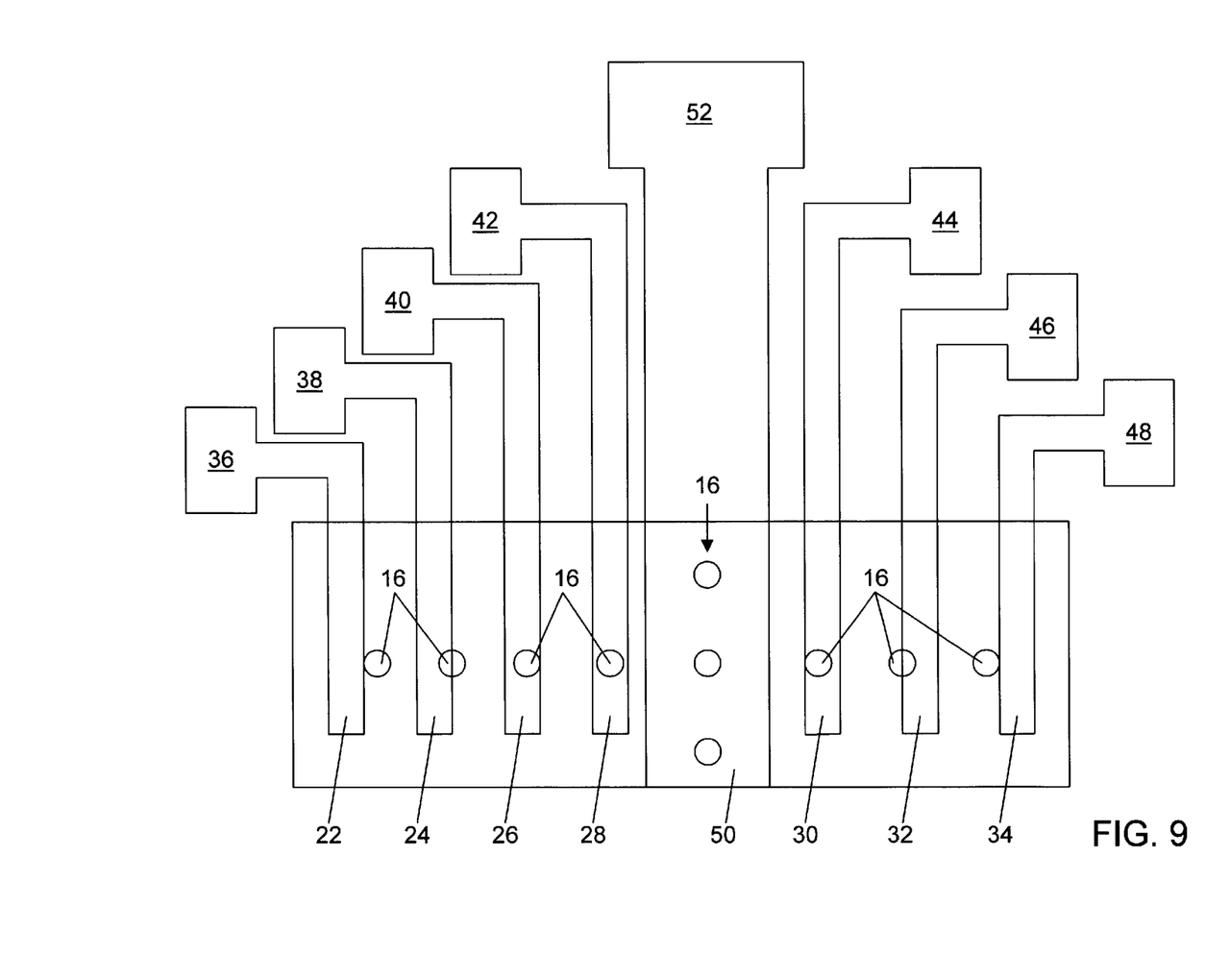
FIG. 9 depicts a top plan view of another embodiment of the targeted test structure in which the test structure is oriented to detect horizontal misalignment.

FIG. 8 depicts another embodiment of a design for an alignment test structure. The midlines 23 of all the targeted conductor areas are positioned such that they do not contact the targeted via areas. Targeted conductor areas 22, 24, 26, and 28 are shifted above their corresponding targeted via areas 16 by varying distances. Targeted conductor areas 30, 32, and 34 are shifted below their corresponding targeted via areas 16 by varying distances. In another embodiment, the configuration of the targeted conductor areas of FIG. 8 may be combined with the configuration of the targeted conductor areas of FIG. 6 to form a single test structure. FIG. 9 depicts an embodiment of a design for a test structure in which the targeted conductor areas extend in a vertical direction instead of a horizontal direction. The targeted conductor areas are offset from the targeted via areas horizontally instead of vertically as in the previous embodiment. Using such a test structure, misalignment of processed conductors in a direction to the left or right of their desired locations can be analyzed.

It will be appreciated to those skilled in the art having the benefit of this disclosure that this invention is believed to provide a method for determining lithography misalignment of a conductive element with respect to a via. It is intended that the following claims be interpreted to embrace all such modifications and changes and, accordingly, the specification and drawings are to be regarded in an illustrative rather than a restrictive sense.

What is claimed is:

1. An alignment test structure, comprising:
   a targeted first via area elevationally below and shifted a first distance from a first midline of a targeted first conductor area;
   a test pad laterally separated from and electrically communicating with said targeted first via area; and
   a conductive element extending from and electrically linked to said test pad, wherein said conductive element is wider than and parallel to said targeted first conductor area, and wherein said targeted first via area is arranged within an interlevel dielectric layer, and wherein said targeted first conductor area and said conductive element extend above said interlevel dielectric layer.

2. The alignment test structure of claim 1, further comprising a targeted second via area elevationally below and shifted a second distance from a second midline of a targeted second conductor area, said first distance being dissimilar from said second distance.

3. The alignment test structure of claim 2, wherein said targeted second conductor area electrically communicates with said test pad.

4. The alignment test structure of claim 2, further comprising additional targeted via areas elevationally below and shifted varying distances from midlines of corresponding targeted additional conductor areas, wherein said targeted additional conductor areas electrically communicate with and are laterally separated from said test pad.

5. The alignment test structure of claim 4, wherein a first group of said additional targeted via areas are shifted from said midlines in a first direction, and wherein a second group of said additional targeted via areas are shifted from said midlines in a second direction opposite to said first direction.

6. The alignment test structure of claim 4, wherein one portion of said additional targeted via areas contact said corresponding additional targeted conductor areas, and wherein another portion of said additional targeted via areas are separated from said corresponding additional targeted conductor areas.

7. The alignment test structure of claim 1, wherein said targeted first conductor area at least partially overlaps said targeted first via area.

8. The alignment test structure of claim 1, further comprising a conductive region extending below said first targeted via and said test pad, wherein said first targeted via and said test pad electrically communicate through said conductive region.

9. The alignment test structure of claim 8, wherein said conductive region is a source/drain region arranged in a semiconductor substrate, wherein said targeted via is above and in contact with said source/drain region, and farther comprising a test via extending between said source/drain region and said conductive element.

10. The alignment test structure of claim 1, further comprising a first probe pad connected to said first targeted conductor area, wherein a width of said probe pad is greater than a width of said first targeted conductor area.

11. An alignment test structure, comprising:
    a plurality of targeted via areas;
    a plurality of targeted conductor areas each corresponding to a respective proximal one of said plurality of targeted via areas and each having a midline shifted from a center of a corresponding one of said plurality of targeted via areas, wherein a first group of said plurality of targeted conductor areas are shifted from the center of corresponding ones of said plurality of targeted via areas in a first direction, and wherein a second group of said plurality of targeted conductor areas are shifted from the center of corresponding ones of said plurality of targeted via areas in a second direction opposite said first direction, and wherein at least one of said plurality of targeted conductor areas at least partially overlaps a corresponding one of said plurality of targeted via areas; and
    a test pad laterally separated from and electrically communicating with said plurality of targeted via areas.

12. The alignment test structure of claim 11, further comprising a centered targeted conductor area having a midline aligned with the center of a corresponding targeted via area and arranged between said first group and said second group of said plurality of targeted conductor areas.

13. The alignment test structure of claim 11, further comprising a conductive element extending from and electrically linked to said test pad, wherein said conductive element is wider than said plurality of targeted conductor areas.

14. The alignment test structure of claim 13, wherein each of said plurality of targeted conductor areas is parallel to said conductive element, and wherein said first and second directions are transverse to said plurality of targeted conductor areas.

15. The alignment test structure of claim 11, wherein said plurality of targeted conductor areas are arranged in a same horizontal plane, and wherein said plurality of targeted via areas are below said plurality of targeted conductor areas.

16. The alignment test structure of claim 11, wherein a distance between the midline of each of said first group of targeted conductor areas and the center of the corresponding one of the plurality of targeted via areas increases in said first direction, and wherein a distance between the midline of each of said second group of targeted conductor areas and the center of the corresponding one of the plurality of targeted via areas increases in said second direction.

17. The alignment test structure of claim 16, wherein a contacting portion of said plurality of targeted conductor areas are in contact with corresponding ones of said plurality of targeted via areas, and wherein a separated portion of said plurality of targeted conductor areas are separated from corresponding ones of said plurality of targeted via areas.

* * * * *